(12) United States Patent
Holcombe et al.

(10) Patent No.: US 7,091,731 B1
(45) Date of Patent: Aug. 15, 2006

(54) FLEXIBLE RIBBON PROBE FOR PERIPHERAL LEADS OF AN ELECTRONIC PART'S PACKAGE

(75) Inventors: Brent A. Holcombe, Colorado Springs, CO (US); Perry M. Keller, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/340,068

(22) Filed: Jan. 26, 2006

(51) Int. Cl.
 *G01R 31/02* (2006.01)
(52) U.S. Cl. .................................... 324/754
(58) Field of Classification Search ............. None
 See application file for complete search history.

(56) References Cited

U.S. PATENT DOCUMENTS

| | | | |
|---|---|---|---|
| 5,859,539 A * | 1/1999 | Wood et al. | 324/758 |
| 6,838,893 B1 * | 1/2005 | Khandros et al. | 324/754 |

* cited by examiner

*Primary Examiner*—Minh Nhut Tang
*Assistant Examiner*—Trung Q Nguyen (57) ABSTRACT

In-situ probing of closely spaced signals of SMT components uses a ribbon of flexible printed circuit material. Upon a first distal end of the ribbon are permanently soldered pins to be soldered to component leads carrying the desired signals. The ribbon may be bent to lie against a surface parallel to the plane of the PCB, where a small amount of adhesive or tape may secure it. That parallel surface may be an empty region of the PCB, may be the top of a component having peripheral leads that are being probed or the top of a nearby component, or (for signals emerging from beneath a BGA without peripheral leads) the parallel surface may be the top of the BGA part itself while the probe tips are soldered to the pins of a nearby SMT device, such as an R-Pack. A stiffener may be permanently carried by the ribbon proximate a location where it contacts the parallel surface. A second distal end couples the signal traces to small coaxial cables leading to the test equipment in use. Working components within the ribbon probe may be disposed thereon proximate the location protected by the stiffener. The ribbon material may be permanently bent to conform to the parallel surface, or it may be externally bent by an attached curved stiffener or by a curved rigid sleeve through which the ribbon passes. As an alternative, the probe tips themselves may be bent in lieu of a bend in the ribbon material.

14 Claims, 6 Drawing Sheets

FLEXIBLE RIBBON PROBE FOR PERIPHERAL LEADS OF AN ELECTRONIC PART'S PACKAGE

BACKGROUND OF THE INVENTION

An ongoing trend in the manufacture of electronic equipment is a reduction in the size of electronic components, and especially that of Surface Mount (SMT) components used in low power high speed digital circuitry (e.g., Dual In-Line Memory Modules, or DIMMs). This is a welcome trend that cooperates with increased functionality of associated Integrated Circuits (ICs) to produce Printed Circuit Boards (PCBs) of high component densities and extensive capabilities.

On the other hand, these reductions in component size are often accompanied by a corresponding increase in lead pitch (number of leads per unit of distance), which is to say, by a corresponding reduction in the center-to-center spacing between adjacent peripheral leads on a package. This complicates the task of probing the signals on those leads; old style probes may have probe tips that are simply too bulky to deploy without shorting adjacent leads, not to mention the difficulty of maintaining contact by hand. Often, the acquisition of a single signal is not sufficient. Many high speed signals are differential, and require probing two leads, in addition to a ground. For the highest pitches the use of 'grabbers' is not feasible, and the industry has resorted to simply soldering the 'flying leads' (short flexible wires) of probes onto the leads to be probed. In the field of logic analysis, a Logic Analyzer often needs to acquire a great many signals at one time, which compounds the problem many times over. Clearly, what is required in these situations is an improved probing technique where the probe tips are attached or otherwise retained in contact with their associated leads.

As we consider what might be done to accomplish such improved probing, we are also reminded that the practice of placing a PCB onto extender boards to expose its components to a relatively unconfined space from within which the human hand can approach them with a probe is, for high speed circuitry, generally not practical: the circuitry on the PCB often simply will not perform properly when connected via such an artificial environment as an extension board. Evidently, a suitable probing technique for such circuits is also one that can remain deployed when the PCB of interest is plugged into its native electrical environment, even though it might have to be temporarily removed therefrom to attach or remove the probe. The implication is that the probe is flexible and has a low profile, as PCBs are often placed in parallel arrays that are rather close together.

Finally, further reflection or experimentation reveals that such small component leads offer very little surface area for solder to join an individual probe tip to a lead, meaning that the solder joint is fairly fragile, as soldered joints go.

Another consideration becomes important when the high speed nature of the signals to be probed is considered. For fast signals it is imperative that there be a minimum of probe tip length that separates the probed component lead and the working components within the probe proper, so as to minimize the introduction of stray inductance and stray capacitance. Often, the initial working component within a probe is an isolation or damping resistance, so that achieving a minimal probe tip length amounts to getting the isolation resistance (or other initial working component) relatively close to the location being probed. This is important for two related reasons: first, it aids in observing with fidelity the (as probed) signal of interest as it occurs; and, second, it minimizes loading so that the signal as probed is essentially the same as it was before it was probed.

Various prior art techniques have been developed to probe a PCB's components, and some of them are more convenient or more reliable than others. There have been 'IC clips' that compress contacts onto leads on opposing sides of a part, 'clothes pin' style as it were, while offering an easy to probe stud or hard wired connection at the other end of the contacts. The geometry of these devices makes them bulky and not suitable for use with high speed high pitch parts. They also greatly extend the effective length of the probe tip, rendering them unsuitable for most high speed use. The same may be said of the 'clip-on grabber' that accepts the central core of a 'scope probe and that is described in U.S. Pat. No. 4,949,032. There have also been probing schemes where the traces on a PCB (say, for a bus of interest) have been extended to reach a conveniently located connector provided for the purpose of receiving a mating connector carried by a cable originating with the test equipment. This can often be made to work with proper attention to adequate drive and proper termination of transmission lines. But it is an expensive solution that is not economical for the various other signals that are on the PCB and that might need probing. There have been 'wedge' probes as described in U.S. Pat. No. 5,463,324 (a version for a quad flat pack IC) and U.S. Pat. No. 5,923,177 (a 'browser' version for a small number of signals). They are relatively expensive, fragile, and are definitely not low profile. The latter means that it is often not possible to use them when the PCB of interest is operated in a native environment of several closely spaced and parallel PCBs plugged into a chassis or motherboard. Nor can wedge probes be used in cases where there is no exposed parallel lead surfaces for the part, such as for BGAs (Ball Grid Arrays whose interconnecting leads are beneath the part) or certain surface mount multiple resistor packs (R-Packs) where the substrate material extends into the space between adjacent leads or where the leads themselves are simply very thin plated traces. There have been various high frequency 'browser' oscilloscope probes intended to be soldered to single ended or differential signals, but they are not suitable for the acquisition of several signals at once.

In summary, the techniques used to probe components having external peripheral leads soldered into through-holes (vias) are generally for moderate to widely spaced leads, and are not suitable for surface mounted components. Techniques developed for probing multiple signals at once for through-hole leads are not extensible for use with the denser lead spacing found on many SMT components. Thus, there is a need for an economical and reliable probing technique that is suitable for several closely spaced signals at once, that is of a flexible low profile and that does not introduce any unnecessary length in the path between the location of probing the signal and the first working component in the probe. We might say that there is a need for high fidelity in-situ probing of signals for SMT parts located on PCBs that are operated in their native environment. It would be desirable if such a new technique were also one that continued to lend itself for use with older style peripheral leads mounted in through holes. What to do?

SUMMARY OF THE INVENTION

A solution to the problem of flexible, low profile, economical and reliable high speed in-situ probing of closely spaced signals of SMT components involves the manufacture of a ribbon-like length of flexible printed circuit material, such as Kapton or thin FR4. Upon a first distal end of the ribbon are lands to which are permanently soldered pins with pre-tinned ends that extend beyond the ribbon-like length. The extending ends of those pins will be soldered to the leads of a component that carries the desired signals. In the frequently occurring case of a densely populated PCB, the first distal end of the ribbon of flexible printed circuit material will tend to be perpendicular to the PCB, and should a component happen to be nearby, a small amount of a suitable adhesive may be placed in the gap between the side of that nearby component's package and the ribbon. Then the ribbon may be bent to lie against a surface parallel to the plane of the PCB, where another small amount of adhesive or tape may hold the bend in place.

That parallel surface may be an empty region of the PCB (in which case the ribbon probe pins may be essentially parallel to the plane of the PCB and the ribbon is not bent), may be the top of the component having the peripheral leads that are being probed or the top of a nearby component, or (for signals emerging from beneath a BGA without peripheral leads) the parallel surface may be the top of the BGA part itself while the probe tips are soldered to the pins of a nearby SMT device the is itself connected to the signals to be probed. This latter case would be to take advantage of one of the frequent instances where the signals of interest are located on adjacent PCB traces that are routed to an SMT R-Pack or similar component. An R-pack is a surface mount package having a plurality of several resistors; other types of components might be carried by similar 'packs.' The R-pack or similar component may have an industry standard pitch for its leads and be located in proximity to the component (say, for signal damping while coupling signals to conductors in a bus).

A stiffener may be permanently carried by the flexible ribbon of printed circuit material proximate a location where the bent ribbon contacts the parallel surface. A second distal end of the ribbon has traces that connect to suitable small coaxial cables that carry the probed signals to the test equipment in use, which may be a Logic Analyzer, or perhaps an Oscilloscope. Disposed upon the ribbon of flexible printed circuit material, and along the location protected by the stiffener, are sets of the working components of the probe, such as isolation or damping resistors and attenuation or matching networks, one such set for each signal being probed. The number of pins and the number of sets of working components may be varied by using different versions of the flexible ribbon probe, according to the number of signals/pins that are present in any given application.

The length of ribbon-like printed circuit material may be permanently bent at the location where it would otherwise be bent to be adhered or secured to the parallel surface, which may be the top of the component being probed, or a different yet nearby component. Alternatively, it may be externally held in that bent condition by a bent stiffener attached to the ribbon or by a curved rigid sleeve through which the ribbon passes.

Individual placement and soldering of a modest or large number of probe tips would be quite difficult and time consuming. These difficulties are mitigated when: (1) The number of probe tips needed matches the number of, and those probe tips align with, the signal leads to be probed on a particular part; (2) The probe tips are all carried on a single ribbon assembly of flexible printed circuit material that is stiff or rigid enough in the plane that carries the probe tips, so that all the probe tips can be simultaneously aligned as a unit operation and then soldered; and, (3) The ribbon assembly is not be so stiff in a direction perpendicular to the plane carrying the probe tips that it cannot be bent through at least 90°. As an alternative, the probe tips themselves may be bent in lieu of a bend in the ribbon assembly.

DESCRIPTION OF A PREFERRED EMBODIMENT

Figure 1:
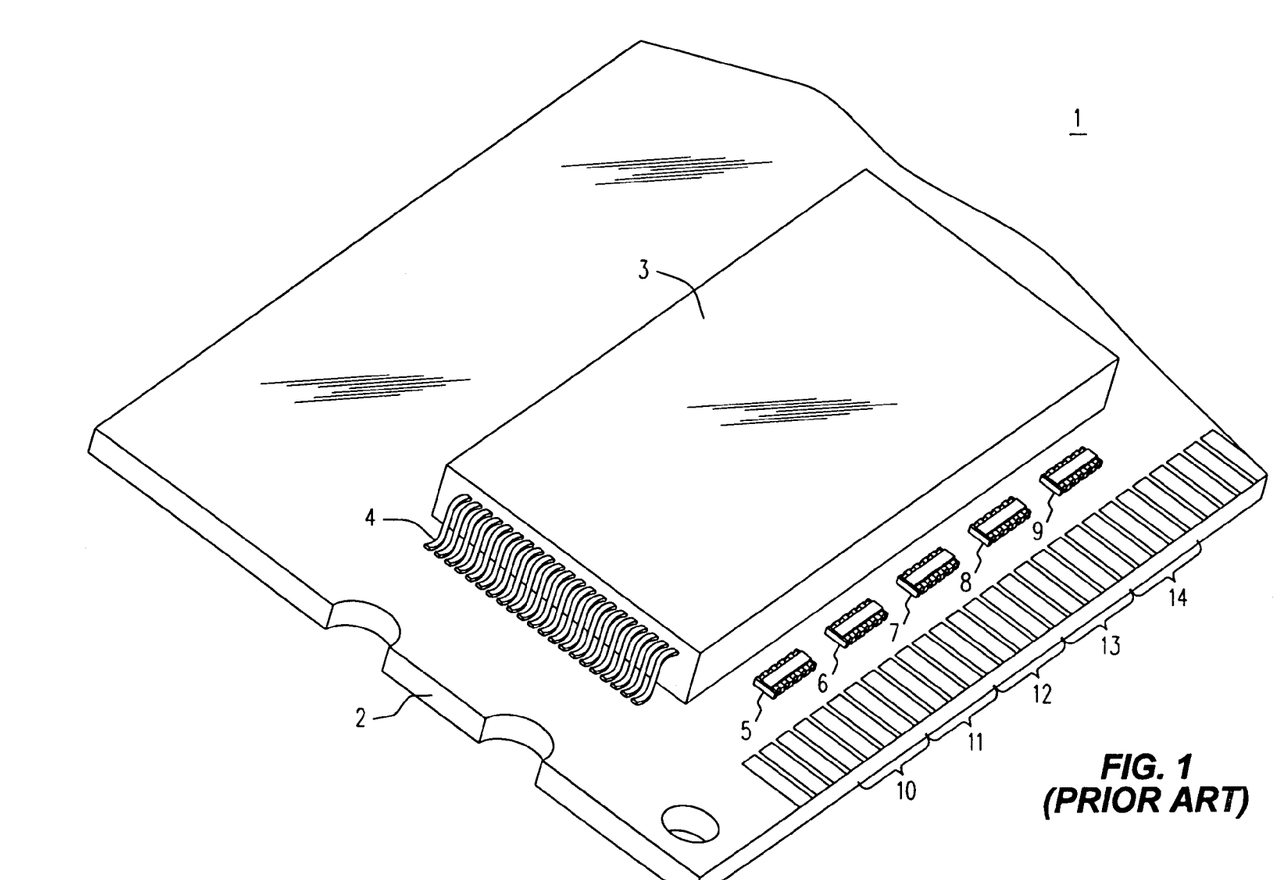
FIG. 1 is a simplified perspective view of a conventional printed circuit board assembly, having surface mount components and R-Packs, and that lends itself to the practice of the invention.

Refer now to FIG. 1, wherein is shown a simplified representation of a high density PCB assembly 1 that includes a printed circuit board or other substrate 2 which carries an IC 3 that may be of the SMT and VLSI (Very Large Scale Integration) or LSI (Large Scale Integration) variety. The IC 3 may have external ('extended') peripheral leads (i.e., 'legs') 4, or be of the BGA variety (in which case the leads 4 would likely be absent). Some SMT parts have external 'surface' leads disposed along their periphery. The R-Packs to be described shortly have such leads, and for that reason no such leads have been shown on the package for IC 3. We are about to describe a 'flexible ribbon probe' that, while it cannot directly probe unexposed BGA pads covered by a part's package, can probe extended peripheral leads of both the surface mount and through-hole type, as well as exposed peripheral surface ('non-extended', 'non-leg') leads of surface mount parts. Whether or not a given signal for an IC can be probed at that IC proper will depend upon there is on the IC an exposed peripheral lead bearing that signal. In some cases where the signal cannot be so found, it can be found on an exposed lead of a different IC or other component. Thus we see that the overall probing situation comprises many individual situations, whose component cases we will now proceed to consider individually.

To continue with FIG. 1, one (exemplary) case we are interested in is where signal traces (not shown) that lead to or from the IC 3 are also connected to lands (10–14) along the edge of the board 2. Those lands mate with a suitable connector (not shown) that is part of a larger electrical environment and which ordinarily includes the high density PCB assembly 1. As an example, PCB assembly 1 might be a SIMM (Single In-line Memory Module) or a DIMM memory assembly for a microprocessor based system of some sort, such as a computer. Frequently, and we shall assume only for the sake of example that it is the case here, the signals on those traces are connected to that larger environment through some isolation component, such as a series resistor of modest value, say in the range of ten to one hundred ohms (and for our purpose, we don't care what the value is or necessarily that it is a resistor, just so that such a component is there). R-Packs such as 5–9 are then frequently used to supply these components. In the particular case we see in FIG. 1, the R-Packs 5–9 are quad R-Packs, and groups of four lands (10–14) are respectively associated with each: 5 with 10, 6 with 11, 8 with 12, 9 with 13, and 9 with 14. It will readily be appreciated that there is no special significance to an R-Pack being of the quad type: any of a variety of numbers of resistors might be found in an R-Pack. Four is a common case. Likewise, the number of R-Packs is not significant, as that will depend on the nature of the IC 3 and how many signals are to be routed to R-Packs of whatever numbers of components each. Furthermore, there is no requirement that all the R-Packs be identical. Nor is there a requirement that the signals to be probed are transiting between the lands of the PCB and an associated IC; the signals might be going on a path between two ICs on the same PCB, with the R-Packs (or similar components) as intervening locations along that path.

The technique of placing several components within a package or onto a substrate with surface mount leads is not limited to just resistors; other components might be used, as well. Rather than coin the term 'C-Pack' for 'Component Pack and then have it confused with 'Capacitor Pack' or use 'P-Pack' for 'Parts Pack' and have someone wonder just what the unfamiliar term 'P-Pack' means, we shall continue using the familiar term 'R-Pack' in an exemplary manner. We will do so with understanding that it is clear that in our description the phrases "R-Pack" and "similar SMT components" contemplates the use of other such multiple components carried on SMT substrates or within SMT packages, besides just resistors.

Before proceeding, and in support of the notion that use of R-Packs for series isolation components is but an example of where the invention may be used, consider the case where the IC contains switches to ground (active pull-downs) or switches to a power supply (active pull-ups), and respective external pull-up resistors or pull-down resistors are needed to develop the signal swing. The R-Packs 5–9 might just as easily be for such a purpose. In such a case the resistor within the R-Pack would not be in series with the signal trace, but merely connected in parallel to it, with the other end of the resistors in the R-Pack connected to either ground or a power supply, as appropriate. Either of the 'in series' or 'in parallel' arrangements might also be used where the signal trace led to a receiver within the IC, as opposed to a driver.

Finally, while it is frequently the case, one should not assume that the R-Packs are always disposed right next to the lands for an edge connector of the PCB assembly; they might be anywhere on the board 2, depending upon how it is laid out. Say, for example, a large PCB assembly has two ICs that talk to each other through intervening traces (which may be significant lengths of transmission lines which the R-Packs assist in terminating). The R-Packs might well be disposed at one or both ends of such intervening traces, and be nowhere near an edge connector for the PCB assembly. What is often the case is that the R-Packs are not 'in the middle of nowhere,' as it were, so that some nearby component (probably, but not necessarily, the IC using the signals associated with the R-Pack) can lend a top surface to assist in maintaining or securing a bend in the flexible probe, as will be described in due course. And in due course, we shall also see that if the R-Pack or other part whose leads are to be probed IS 'in the middle of nowhere' then an empty section of the PCB itself can serve as a location to secure the ribbon probe, and that the bend therein might be absent.

Figure 2:
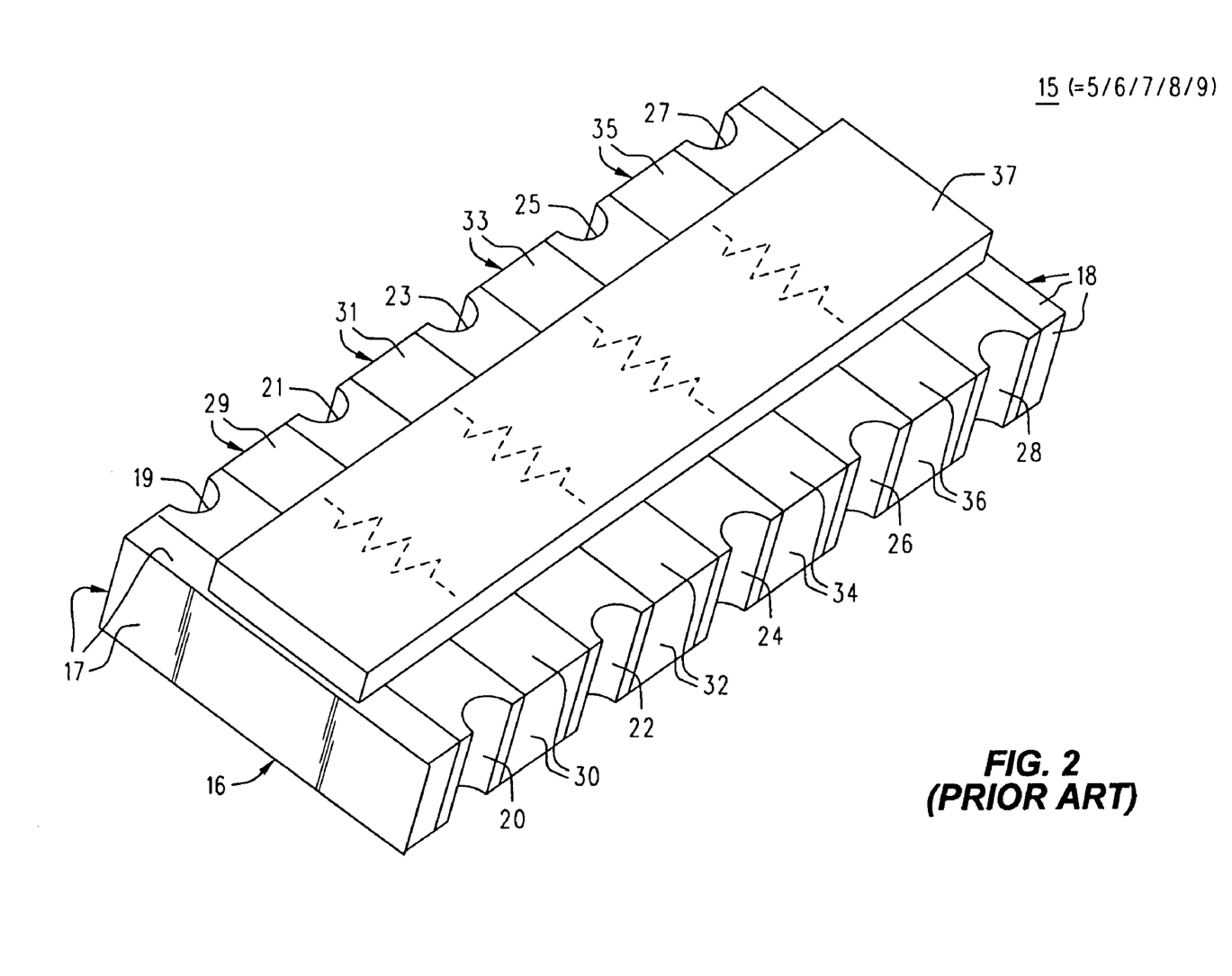
FIG. 2 is a simplified perspective view of a conventional surface mount R-Pack with which the invention may be practiced.

We turn now to FIG. 2 and the nature of the R-Packs 5–9. Bearing in mind that a quad R-Pack is merely exemplary, both as to number and type of components, consider the (conventional) R-Pack 15 shown in FIG. 2. It is formed of a block 16 of substrate material (e.g., a suitable ceramic) upon which are formed and deposited various features and other elements. For example, it may receive end caps 17 and 18 that adhere well to the substrate and that are solderable. Their function is to increase the number of locations at which (and thereby the strength with which) the R-Pack 15 is attached to a PCB or other substrate. Opposing vertical and horizontal conductive and solderable surfaces 29 and 30 are deposited through suitable processes (e.g., vapor deposition, masking and etching as in thick film processing), as are parallel instances of other such vertical and horizontal conductive and solderable surfaces: 31/32, 33/34, and 35/36. These various surfaces 29–36 (as well as end caps 17 and 18) might also wrap around to the under side of the substrate 16, so as to 'sit on top of' their respectively associated pads on the PCB, the better to promote a good solder joint.

The dotted lines for the resistor symbol show generally where the resistors that give the R-Pack its name are deposited. A hermetically sealed cover 37 might be applied over the resistors to protect them from the elements.

Figure 3:
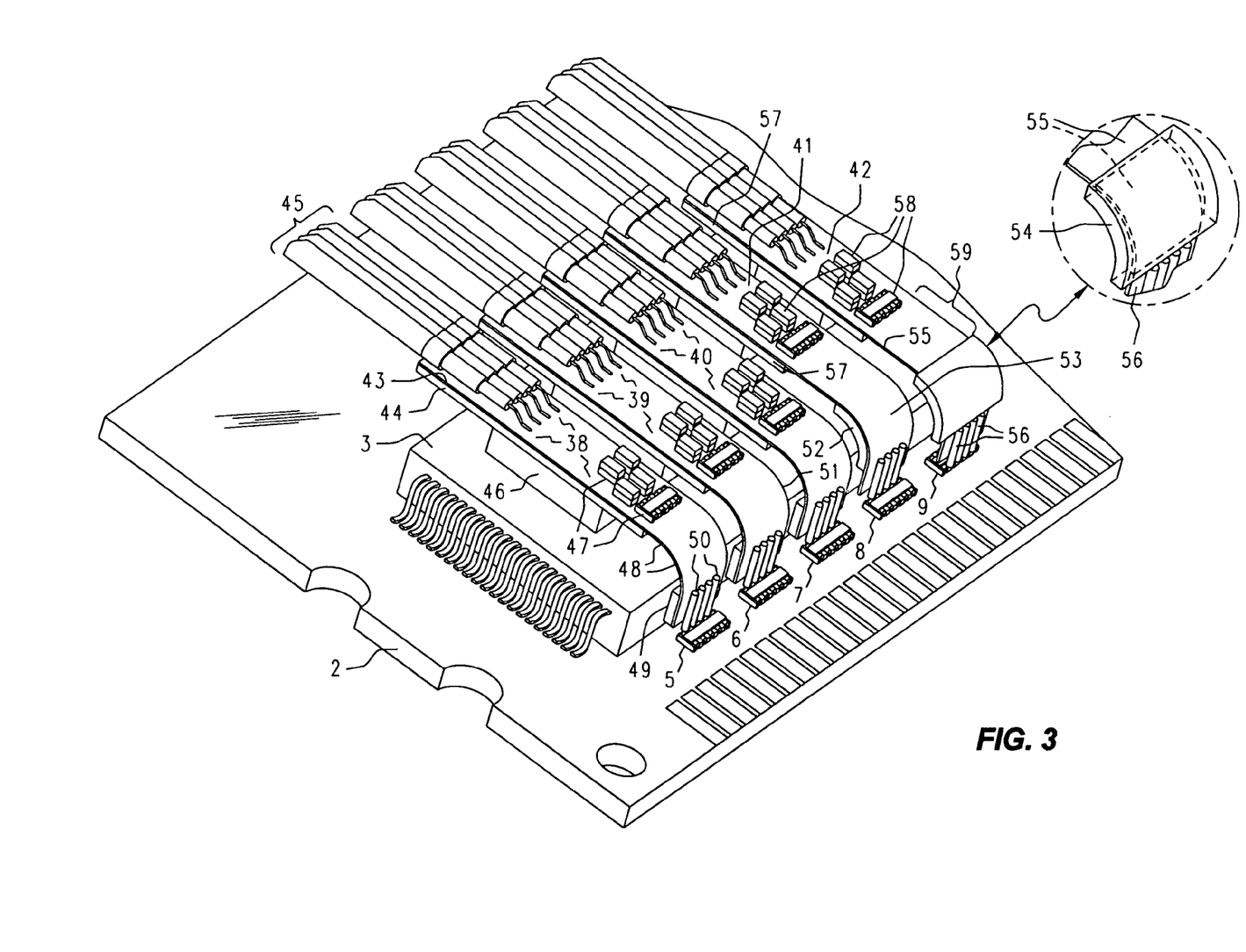
FIG. 3 is a simplified perspective view of bent flexible probes attached to the printed circuit board assembly of FIG. 1 at its R-Packs.

Before leaving FIG. 2 we need address the 'scallops' or recessed regions 19–28. Some R-Packs have them, some do not. Their purpose, when present, is to lengthen the path between adjacent locations of solderable connection, the better to prevent unintended solder bridges when the part is soldered to the PCB that carries it. These recesses are not necessary for the R-Pack to be suitable for use with the flexible ribbon probe for surface mount R-Packs and similar components that is shown in FIG. 3, or with the other ribbon probes that are also described herein. In particular, the recesses are not needed to register any portion of the flexible printed circuit (ribbon) probe we are about to describe.

It will now be appreciated that once the R-Pack 15 is soldered in place on the PCB, the vertical (or horizontal) parts of one set of surfaces 29/31/33/35 or 30/32/34/36 are places where the signal for the associated trace can be probed, provided that a suitable probe is used. And that, of course, is the problem, since we stipulated earlier that there is no extender board permitted, and that easy (e.g., 'line of sight') access to the leads of the R-Pack (or to any other probable locations) is obscured by surrounding elements of the SUT (System Under Test). Furthermore, it is likely that the center-to-center spacing of surfaces 29–31, 31–33, . . . and of 30–32, 32–34, . . . , is pretty darn small: say on the order of 0.020" or 0.5 mm. It seems that a suitable probe is not simply an ordinary hand-held one! And, whatever it is, it would be well if it had probe tips that already matched in number and spacing the particular lead/surfaces (such as 29/31/33/35 or 30/32/34/36) that are to be probed. Individual placement of a modest or large number of closely spaced tiny objects would be quite difficult, especially when they each are to be soldered. This difficulty can be mitigated when, as in the flexible probes (ribbon probes) described below in connection with FIGS. 3–8, the number of probe tips needed to match the number of, and align with, the signal leads to be probed on a particular part were all carried on a single ribbon assembly of flexible printed circuit material that is stiff or rigid enough in the plane that carries the probes that all the probe tips can be aligned as a unit operation, and then soldered. That ribbon assembly should not be so stiff in a direction normal to that plane that it cannot be bent through at least 90°, if such is needed to get the ribbon of flexible printed circuit material out of the way once the flexible ribbon probe is attached. As an alternative, and as shown in FIG. 8, the probe tips themselves may be bent in lieu of, or perhaps in addition to or in conjunction with, a bend in the ribbon assembly.

Without further ado, then, refer now to FIG. 3. In this figure we show how flexible ribbon probes 38,39,40,41, and 42 may be constructed to allow probing of signals whose traces are connected to an R-Pack or similar component (or, as will be shown in due course, to peripheral leads of an IC that is not an R-Pack). Taking flexible ribbon probe 38 as an example, a suitable length, or ribbon, 43 of thin (e.g., 0.038") flexible printed circuit material, which may be of Kapton, carries at a first distal end a number of suitable signal cables (e.g., shielded cables, transmission lines) 45. In the case of a flexible ribbon probe for a quad R-Pack there will be four such cables 45; for a 'hex' R-Pack there would be six, and so on. It will be appreciated that the flexible printed circuit 43 may be a multi-layer affair, and that it has traces that are not shown.

The flexible ribbon probe 38 may contain on a top, or outer, surface of the flexible printed circuit 43 various resistive and capacitive or other components 47, (which components 47 may comprise per-signal coupling, isolation or attenuation networks, or a per-signal combination of any of those functions). These components 47 are suitable intervening circuitry for connecting the cables 45 to their respective signals. Also, one should not assume that components 47 are necessarily only passive parts; active parts could be disposed there, as well, if desired. Furthermore, in the example shown the components 47 are on the 'top' surface of the ribbon probe 38. This is appropriate for the circumstances shown, and it will be appreciated that there may be other circumstances where it would be more convenient if components 47 were on the 'bottom' side of the ribbon of flexible printed circuit material.

On a straight section of the flexible ribbon probe 38 that is generally at or near the location of the cable attachment and the components 47, and on the other side (the underside, as it were, or the inside—in relation to the top of IC 3 or the inside surface of curve 48), is attached a stiffener 44. It may be of any suitable material, such as FR4, or perhaps a plastic.

At location 48, generally opposite an edge on IC 3 proximate the location of an R-Pack 5 whose signals are to be probed, the flexible probe 43 exhibits a curved bend that allows the ribbon of flexible printed circuit 43 to angle down so that a second distal end of the ribbon 43 is adjacent to vertical surfaces (29/31/33/35) of the R-Pack 5 (assuming that 15 of FIG. 2 is oriented the same as 5 of FIGS. 1 and 3).

A suitable plurality (e.g., one per signal—which in the case shown is four) of rods, pins or short wires 50 are soldered over a suitable portion of their length to respective exposed pads on the flexible printed circuit 43, such as to provide a reliable mechanical connection that endures despite subsequent (and careful) soldering upon the remaining portion. The remaining exposed portions of such rods or pins, which may be of Beryllium Copper with a Nickel Gold plating, or perhaps of Kovar, are pre-tinned and in alignment with, and touching, the aforementioned vertical surfaces (29/31/33/35), and when in use are soldered thereto. The rods or pins 50 may be of round, square or rectangular cross section. Such rods or pins are likely to be fairly stiff for their (short) length, and would not ordinarily be considered flexible. If they were bent (see FIG. 8) they would probably be permanently bent ahead of time (using a jig and/or suitable tools) and remain bent, with the likely result of an attempt to re-bend them resulting in a fracture of the material.

On the other hand, short wires, such as solid annealed and tinned copper, are flexible to approximately the same degree as the ribbon cable to which they are attached. While they will stay bent upon flexure, they can also subsequently be readily straightened by hand tools (or just with the fingers) in preparation for use in another project. Once straightened (or pre-bent!) they will support their weight and not droop, so as to maintain a desirable alignment with the leads to which they are to be soldered. Once soldered, they can, if needed, be carefully bent in lieu of requiring all needed bending to be borne by the flexible ribbon cable, and do so without breaking the solder joints. Hereinafter, the terms 'rods' and 'pins' will be understood to also include the short wires just described, unless it is clear that such short wires are to be excluded.

Elements 49 and 46 represent a suitable adhesive (e.g., a fast setting epoxy glue, or perhaps a double sided adhesive tape—the closed cell foam variety is powerful stuff).

Here is how flexible probe 38 is affixed to its R-Pack 5. Using a microscope, a technician places the unbent probe having pre-tinned and fluxed pins 50 in alignment with fluxed surfaces (29/31/33/35) of the R-Pack. Heat is applied with a soldering apparatus, such as a soldering iron with a fine (very small!) tip. The addition of further solder ought not be needed, owing to the pre-tinning of the pins 50. With reasonable care the rods or pins 50 will solder to the leads of the SMT R-Pack without becoming un-soldered from the lands of the ribbon of flexible printed circuit, owing to the greater thermal mass of that (longer) portion of the pins and the lands and their traces within the flexible printed circuit.

Owing to the small size of the areas being soldered (say, 0.010" to 0.020" by however high the SMT lead rises above the surface of the PCB, which could be in the range of 0.020" to 0.060") it is appropriate to characterize them as 'micro' solder joints. Since they are so small, they do not have much of either tensile or shear strength, and if the ribbon of flexible circuit material is nominally straight, so that curved bend 48 is made after soldering, attaching the probe 38 to surfaces (29/31/33/35) facing the IC (as shown in the figure) is generally necessary, as experience has shown that solder joints made to the opposing non-facing surfaces (30/32/34/36) will sometimes break as the bend 48 is created. The resilient desire of the curved bend 48 to straighten means that soldering the rods 50 to surfaces (29/31/33/35) places the micro solder joints into compression, whereas soldering to surfaces (30/32/34/36) will place them under tension.

It will now be appreciated that the width of the ribbon of a (non-permanently bent) flexible printed circuit probe is approximately as wide as the R-Pack that it is to be soldered to. In any event, it is at least as wide as the overall edge-to-edge dimension of the number of pins that it is to carry for soldering to the corresponding leads that are to be probed. Making the ribbon much wider than that lower limit simply increases the force needed to create the bend 48, and increases the likelihood of interference with other parts. These are the considerations we have in mind when we say that the width of a non-permanently bent ribbon is approximately as wide as the associated leads to be probed (which might be only four out of six on a six-wide R-Pack). In the case of a permanently bent element in the ribbon probe (see 51, 52 and 54 in FIG. 3, FIG. 7 and FIG. 8), the issue of forces on the solder joints is of less concern, and a six-wide (or wider) ribbon probe might well be perfectly suitable for a four-signal application.

Once the joints are soldered (or perhaps even before soldering), an amount of adhesive 49 may optionally be placed in a space between the side of the IC 3 and the surface of the ribbon of flexible printed circuit facing that side. Once the soldering is accomplished and any adhesive 49 has set, the bend 48 is performed and the underside of stiffener 44 may be adhered to the top of the IC 3 with a suitable material (e.g., a fast setting epoxy glue or perhaps double sided closed cell foam tape, or, 'band-aid style' with a short piece of narrow tape—industrial strength duct tape is good stuff, as is Kapton tape—, in the manner shown in FIG. 5).

Once the rods 50 are soldered and the flexible probe 38 is anchored by any adhesives (46, 49), the far ends (not shown) of the cables 45 are attached to the test equipment, such a Logic Analyzer, and the PCB assembly returned to its normal environment within the SUT, whereupon the probed signals may be observed.

Various alternate embodiments are also possible. In one, the bend 51 is already a permanently present aspect of the probe 39. This bend may be imparted to the flexible circuit board of probe 39 during its manufacture (e.g., through the application of heat, followed by cooling while bent) so that it is normally bent but still flexible. The bend might be a curved (i.e., having a radius) bend as shown, or it might be an abrupt right angled bend (i.e., a 'corner'). Other alternatives are to adhere ahead of time a permanently a curved stiffener 52 (shown on probe 41) to one or both of the inside (shown) or outside (not shown) of bend 53. Probe 42 has instead a rigid curved sleeve 54 of suitable material having a slot therethrough that compels the flexible printed circuit 55 of probe 42 to bend. Sleeve 54 may be slipped over the flexible printed circuit material 55 of probe 42 before the rods 56 are initially soldered to the probe 42.

It may be desirable for probes 41 and 42 may have stiffeners 57 that are shorter than otherwise, and their components 58 closer to the cables, to allow a gap 59 between them and curved stiffener 51/sleeve 54 and thus preserve flexibility, lest the length of a now not-so-flexible ribbon of printed circuit having a long stiffener (like 44) and components (like 47) combine with 52/54 to become a rigid 'long handled wrench' capable of severely bending the row of rods (e.g., 56) and breaking the micro solder joints. The use of (flexible) annealed wire in place of (stiff) rod may be advantageous in such situations.

If any of the permanent bends described above are used, then: (1) Adhesive 49 may be unnecessary, and; (2) The rods, pins or wires (e.g., 56) can now be attached to the FAR side (i.e., to 30/32/34/36) of the R-Pack if desired (which is to say to either side!), since the bend does not attempt 'unbend' and apply tensile force to the micro solder joints.

In FIGS. 4–8 and their descriptions that follow, elements that are the same as, or are substantially the same as, earlier shown counterparts appearing in FIGS. 1–3 are subsequently identified by common (i.e., the earlier used) reference numerals.

Figure 4:
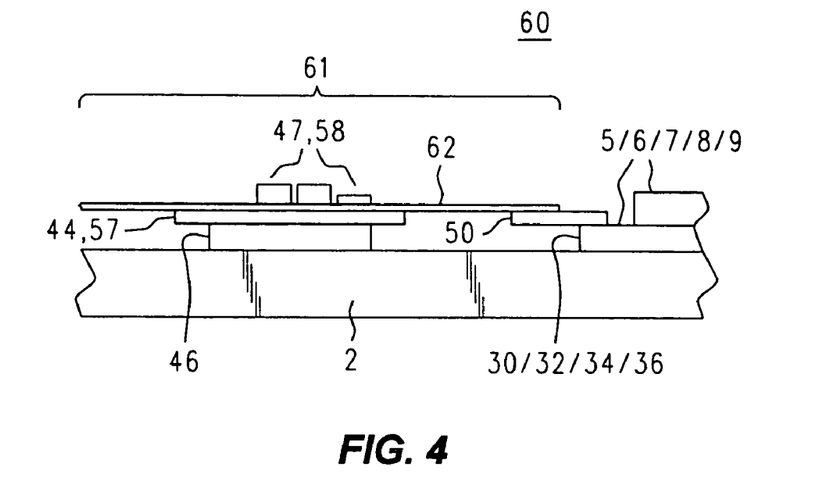
FIG. 4 is a simplified side view of a flexible yet unbent probe that is attached to a surface mount R-Pack or similar component carried by a printed circuit board and that is secured to a nearby empty region thereof with adhesive or double sided tape.

Refer now to FIG. 4, wherein is shown an alternate embodiment 60. FIG. 4 is a simplified side view of a flexible yet unbent ribbon probe 61 that is attached to a surface mount R-Pack (5/6/7/8/9) or similar component carried by a printed circuit board 2 and that is secured to a nearby empty region thereof with adhesive or double sided tape (46). In the embodiment of ribbon probe 61 (per-channel) rods/pins/wires 50 are on the 'underside' of the ribbon 62 (i.e., on the side opposite that carrying the (per-channel) components 47/58 and on the same side as the stiffener 44/57). The rods/pins/wires 50 might as easily be on the 'top' side of the ribbon 62. In any event, the arrangement shown assumes that the leads 30/32/34/36 that are contacted by the rods/pins/wires 50 are of the sort shown in FIG. 2, wherein they ascend the vertical side of the surface mount R-Pack or similar component, and travel for some useable distance horizontally along the top surface of that R-Pack or similar component. As can be appreciated from the figure, rods/pins/wires 50 contact the leads 30/32/34/36 along these horizontal sections, rather that along the vertical sections. Furthermore, and after a brief look at FIG. 6, it will be appreciated that the adhesive 46 in FIG. 4 could be in contact with a suitable component (as with, say, 67 in FIG. 6), rather than with an empty section of the PCB 2. In such a case, the ribbon 62 might exhibit a slight S-bend, depending upon the extent to which the component/adhesive (67/46) and the R-Pack differ in height. Still, compared to a near 90° bend, such a slight S-Bend in the ribbon 62 is essentially negligible, which is why we mention it here in conjunction with the 'unbent' ribbon embodiment 60 just previously described.

Figure 5:
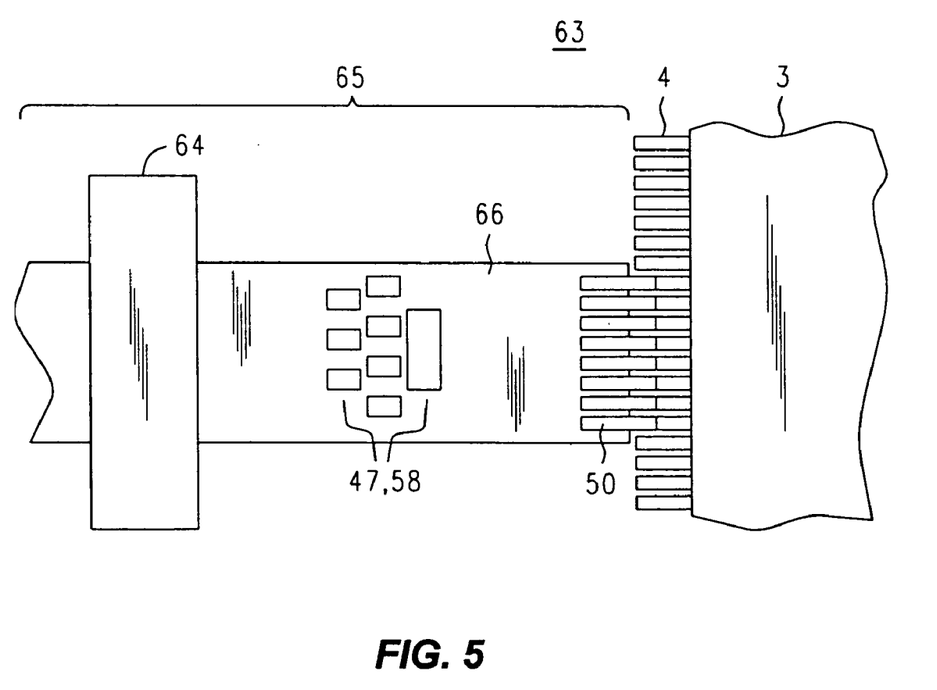
FIG. 5 is a simplified top view of a flexible yet unbent probe that is attached to the extended metal legs of a component carried by a printed circuit board and that is secured to a nearby empty portion thereof with a strip of suitable single sided tape.

FIG. 5 is a simplified top view of another embodiment 63 with an 'unbent' ribbon case similar to the that described above in connection with FIG. 4. The ribbon probe 65 has its rods/pins/wires 50 on the 'top' surface of the ribbon 66, and the leads 4 to be contacted belong to a part 4 having extended leads (which may be of either the SMT or the through-hole variety). In either case, the rods/pins/wires 50 contact the leads 4 along generally horizontal sections of those leads. Finally, a strip of suitable tape 64 (Kapton tape works well, while duct tape is a universal favorite) anchors the ribbon probe 65 to the PCB (not shown).

Figure 6:
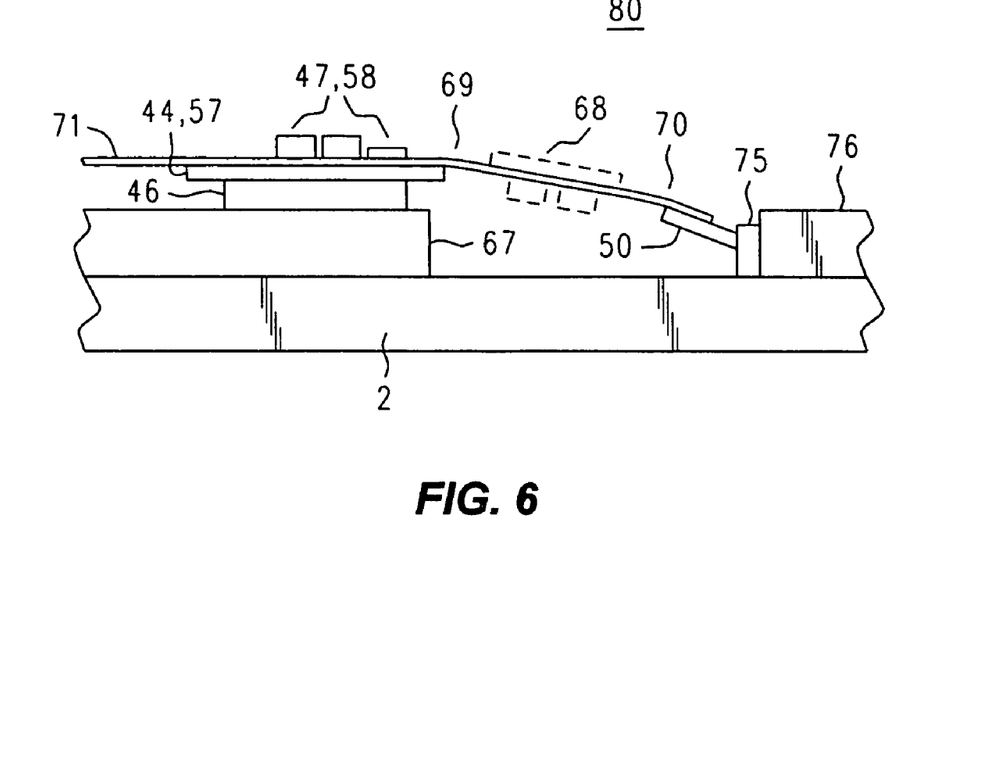
FIG. 6 is a simplified side view of a flexible probe that is attached to either extended leads or plated-on leads for a component carried by a printed circuit board assembly and that is secured to the top of a nearby component.

Refer now to FIG. 6, which is a simplified side view of yet another embodiment 80 involving a partially bent ribbon probe wherein the rods/pins 50 contact leads 75 at an angle. As before, ribbon 71 carries a stiffener (44, 57) on its underside, and adhesive 46 secures the ribbon to a nearby component (67). Components 47/58 are shown in their usual position, while dotted lines 68 depict alternate locations for such components and an associated stiffener (an arrangement that reduces the overall height of the embodiment 80). Note that ribbon 71 is shown as slightly bent at locations 69 and 70. The exact nature of this bending may be influenced by which of the per/channel components locations (47/58, 68) are employed. If the location 68 is used, then the bends may well be as depicted, while if location is as for 47/58, then there may well be a gradual bending of 71 in the interval between locations 69 and 70. On the other hand, if the application is specific and known in advance, the ribbon 71 might be given suitable permanent bends at locations 69 and 70, regardless of where the per-channel components are located.

Now consider the part 76 whose leads 75 are to be probed. The package of the part is represented by 76, and might be of any of the well known types. Lead(s) from the package 76 are represented by 75, and will be appreciated as a non-pictorial symbolic representation of any of the sorts of leads previously discussed. (That is, we confess that the shape of 75 does not resemble a particular style of lead in particular, but is intended to connote the graphically awkward case of a rod/pin 50 contacting either a vertical or horizontal section of either a plated lead or an extended lead.)

Figure 7:
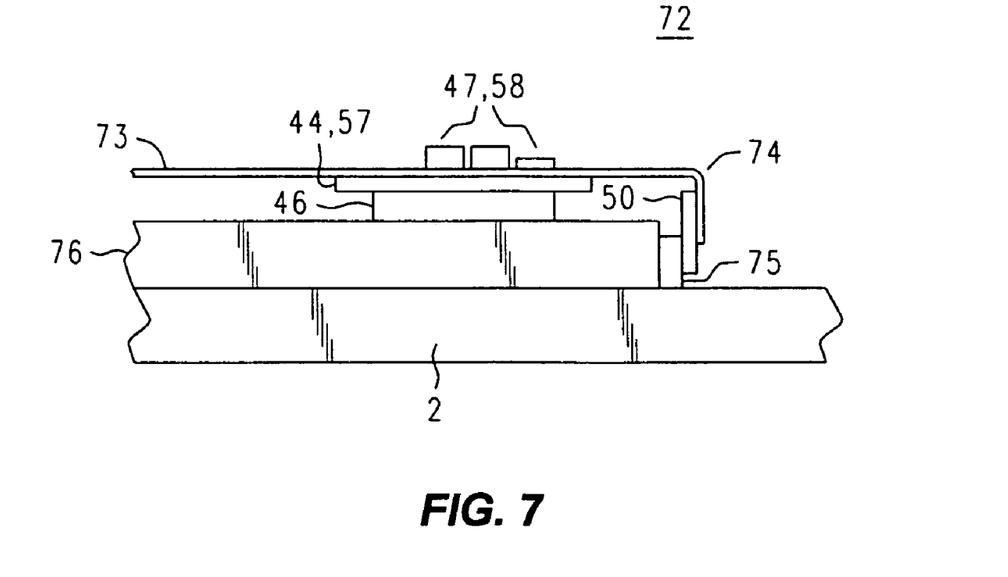
FIG. 7 is a simplified side view of a permanently and abruptly bent flexible probe that is attached to either extended leads or plated-on leads for a component carried by a printed circuit board assembly and that is secured to the top of same component.
Figure 8:
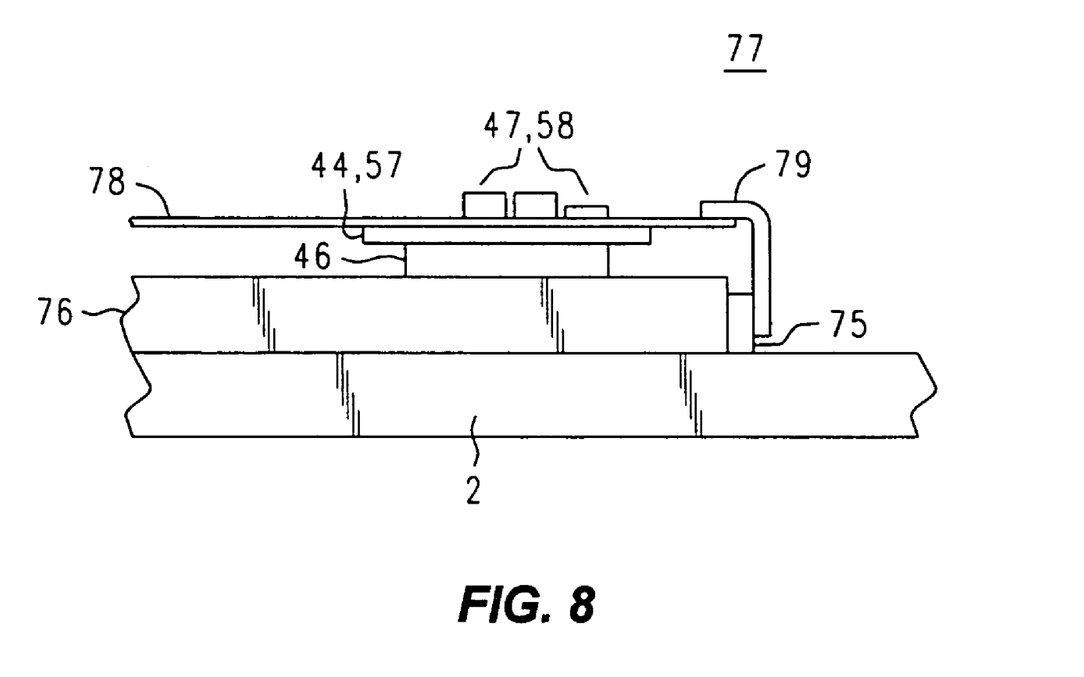
FIG. 8 is a simplified side view of an unbent flexible probe that is attached by abruptly bent pins to either extended leads or plated-on leads for a component carried by a printed circuit board assembly and that is secured to the top of same component.

We turn now to FIG. 7, wherein is depicted an alternate embodiment 72 wherein the ribbon 73 has a permanent bend at location 74 that may be of 90°. In this embodiment the ribbon probe is affixed to the top of a package (part) 76 whose leads 75 are to be probed along a periphery of the part 76. The remarks made in the discussion of FIG. 5 pertaining to the nature of the package 76 and of its leads 75 are applicable here, as well (as they are also to FIG. 8, mentioned below). In the embodiment 72 of FIG. 7, however, the amount of bend at location 74 will advantageously be selected to cause rods/pins 50 to be parallel to preferably straight sections of the leads 75 where soldering will produce the strongest joint. For example, if vertical sections of the leads are to be soldered to, then a 90° bend at location 74 is appropriate.

Finally, FIG. 8 depicts an alternate embodiment 77 that is similar in many respects to that 72 shown in FIG. 7. The difference is that ribbon 78 stops proximate the periphery of the package 76, and rods/pins/wires 79 provide the bend corresponding to that at location 74 in FIG. 7. As in FIG. 7, the amount of the bend corresponds to the nature of lead 75 and where thereon is the best location to form the solder joint. In FIG. 8, lead 75 has a suitable straight section that is vertical, and the bend in rods/pins/wires 79 is advantageously 90°. It might be otherwise, say, 45° if the lead 75 were an extended lead having an S-bend with a straight center section angled down toward the PCB at 45° also.

It will now be appreciated that the ribbon probe described herein may advantageously be used to make probing connections to both SMT parts having densely spaced peripheral leads, whether of the plated ('non-legged') or extended (legged) variety, as well as to older styles of external peripheral leads (legs) soldered into through holes of a PCB.

We claim:

1. An electrical probe for a plurality of n-many target signals present on n-many leads of an electronic part's package, the electrical probe comprising:
   a flexible printed circuit of a width at least that needed to span the n-many leads of the electronic part's package on which the target signals are present and of a length sufficient to allow a variable bend of at least 0° to 90° proximate a first end of the flexible printed circuit and also to extend in a direction toward an opposite second end and allow the attachment of cables at the second end, the flexible printed circuit carrying at least n-many signal traces;
   n-many interconnecting cables attached at the second end of the flexible printed circuit, that connect to respective ones of the n-many signal traces and that connect the electrical probe to an instance of electronic test equipment;
   n-many pins soldered to respective lands at the first end of the flexible printed circuit and that are each associated with a respective one of the n-may signal traces, each of the n-many pins extending beyond the first end by an amount sufficient to overlap at least a portion of the height by which leads on the electronic part's package extend in the direction perpendicular to a circuit board assembly to which the electronic part's package is mounted;
   the spacing of the n-many pins matching the spacing of the n-many leads of the electronic part's package; and
   coupling components disposed on a first surface of the flexible printed circuit between the second end and the location of the variable bend, the coupling components connected to associated ones of the n-many signal traces and coupling the target signals at the n-many pins to respective ones of the n-many interconnecting cables.

2. An electrical probe as in claim 1 wherein the electronic part's package is a surface mount package carried by a printed circuit assembly, wherein the n-many pins are soldered to the n-many leads of the surface mount package, and further wherein the first stiffener is adhered to the top surface of another component on the printed circuit assembly proximate the surface mount package, thereby inducing the variable bend.

3. An electrical probe as in claim 2 wherein the first end of the flexible printed circuit is adhered on the side opposite that carrying the n-many pins to a proximate surface of the another component.

4. An electrical probe as in claim 2 wherein the flexible printed circuit is fastened to the circuit board assembly with a strip of tape proximate the second end of the flexible printed circuit.

5. An electrical probe as in claim 1 further comprising a curved stiffener adhered to the side of the flexible printed circuit opposite that which carries the coupling components and at a location between the coupling components and the first end, thereby introducing at the location of the variable bend a fixed bend in the flexible printed circuit.

6. An electrical probe as in claim 1 further comprising a rigid curved sleeve having a slot therethrough sized to admit the flexible printed circuit, the rigid curved sleeve located along the flexible printed circuit at the location variable bend, thereby introducing a fixed bend in the flexible printed circuit.

7. An electrical probe as in claim 1 wherein the variable bend comprises a permanent bend in the flexible printed circuit at a location between the coupling components and the first end.

8. An electrical probe as in claim 7 wherein the permanent bend is a length of essentially uniform curvature approximating a quarter circumference of a circle.

9. An electrical probe as in claim 7 wherein the permanent bend approximates a sharp 90° corner.

10. An electrical probe as in claim 1 further comprising a first stiffener attached to a second surface opposite the first surface of the flexible printed circuit, and along a location proximate the coupling components.

11. An electrical probe as in claim 1 wherein the n-many pins are bent at an angle to allow a portion of each pin to be essentially parallel to a portion of an associated respective lead of the n-many leads of the electronic part's package.

12. An electrical probe as in claim 1 wherein the n-many pins comprise lengths of bendable wire.

13. An electrical probe as in claim 1 wherein the electronic part's package is an R-Pack upon whose leads the target signals are probed in lieu of probing them at another electronic part associated with those target signals but whose leads are inaccessible.

14. An electrical probe as in claim 1 wherein the electronic part's package is an integrated circuit upon whose leads the target signals are probed in lieu of probing them at another electronic part associated with those target signals but whose leads are inaccessible.

* * * * *